(12) United States Patent
Lin et al.

(10) Patent No.: US 7,590,519 B2
(45) Date of Patent: Sep. 15, 2009

(54) DISTRIBUTED SYSTEM SIMULATION: SLOW MESSAGE RELAXATION

(75) Inventors: Shiding Lin, Beijing (CN); Aimin Pan, Beijing (CN); Rui Guo, Beijing (CN); Zheng Zhang, Beijing (CN)

(73) Assignee: Microsoft Corporation, Redmond, WA (US)

( * ) Notice: Subject to any disclaimer, the term of this patent is extended or adjusted under 35 U.S.C. 154(b) by 221 days.

(21) Appl. No.: 11/269,133

(22) Filed: Nov. 8, 2005

(65) Prior Publication Data

US 2007/0129928 A1 Jun. 7, 2007

(51) Int. Cl.
G06F 9/455 (2006.01)
(52) U.S. Cl. .............................. 703/17; 703/6; 703/13; 709/224; 709/230; 709/248
(58) Field of Classification Search .................. 703/17, 703/14, 13, 16, 20, 22; 709/248, 217, 224; 707/104.1, 202; 370/351; 719/318; 712/36; 716/5; 717/104

See application file for complete search history.

(56) References Cited

U.S. PATENT DOCUMENTS

| 6,341,262 | B1 * | 1/2002 | Damani et al. ................. 703/16 |
| 6,466,898 | B1 * | 10/2002 | Chan ............................ 703/17 |
| 6,937,969 | B1 * | 8/2005 | Vandersteen et al. .......... 703/14 |
| 7,246,055 | B1 * | 7/2007 | Singh ............................. 703/20 |
| 2002/0059052 | A1 * | 5/2002 | Bloch et al. .................... 703/13 |
| 2003/0050771 | A1 * | 3/2003 | Grohmann et al. ............. 703/22 |
| 2003/0093256 | A1 * | 5/2003 | Cavanagh et al. .............. 703/14 |
| 2003/0093569 | A1 * | 5/2003 | Sivier et al. ................... 709/248 |
| 2003/0135612 | A1 * | 7/2003 | Huntington et al. ........... 709/224 |
| 2003/0167454 | A1 * | 9/2003 | Iordanov et al. .............. 717/104 |
| 2004/0024578 | A1 * | 2/2004 | Szymanski et al. ............. 703/17 |
| 2004/0221251 | A1 * | 11/2004 | Bozkaya et al. .................. 716/5 |
| 2005/0091025 | A1 * | 4/2005 | Wilson et al. .................. 703/16 |
| 2006/0004862 | A1 * | 1/2006 | Fisher et al. .............. 707/104.1 |
| 2006/0023691 | A1 * | 2/2006 | Franchuk et al. ............. 370/351 |
| 2006/0053211 | A1 * | 3/2006 | Kornerup et al. ............. 709/217 |
| 2006/0075210 | A1 * | 4/2006 | Manohar et al. ............... 712/36 |
| 2006/0080675 | A1 * | 4/2006 | Franchuk et al. ............. 719/318 |
| 2007/0130219 | A1 * | 6/2007 | Lin et al. ...................... 707/202 |

OTHER PUBLICATIONS

Quaglia et al., "Grain sensitive event scheduling in Time Warp parallel discrete event simulation", IEEE 2000.*
Nicol et al., "Performance modeling of the IDES Framework", IEEE 1997.*
Panesar et al., "Adaptive Flow control in Time Wrap", IEEE 1997.*
Palaniswamy et al., "Scheduling time wrap processes using adaptive control techniques", 1994 Winter simulation Conference.*
Lin et al., "Simulating Large-scale P2P systems with the WIDS toolkit", IEEE, 2005.*
Ferscha et al., "Self-adaptive logical processes: the probabilistic distributed simulation protocol", IEEE 1994.*

* cited by examiner

Primary Examiner—Paul L Rodriguez
Assistant Examiner—Kandasamy Thangavelu
(74) Attorney, Agent, or Firm—Lee & Hayes, PLLC (57) ABSTRACT

Distributed system simulation is enhanced by extending the simulation window. In a described implementation, the simulation window extension is facilitated with a slow message relaxation scheme. For example, especially when the simulation window is extended, slow unscheduled events can arrive at a logical process with a timestamp that is prior to (e.g., less than) the local time of a receiving logical process that is participating in a simulation. To ameliorate issues created by a slow unscheduled message and its corresponding slow unscheduled event, a current logical time of the receiving logical process is substituted for the original timestamp of the slow unscheduled event to transform it into a punctual unscheduled event.

13 Claims, 8 Drawing Sheets

DISTRIBUTED SYSTEM SIMULATION: SLOW MESSAGE RELAXATION

BACKGROUND

Distributed systems can involve networks having hundreds, thousands, or even millions or more nodes. Because building such large systems for experimental purposes is cost prohibitive, simulation is important to understanding and efficiently designing and implementing distributed systems. Simulation can play a sizable role at different stages of the development process and for different aspects of the distributed system being created. For example, both the distributed protocol and the system architecture may be simulated after conception and during iterative testing and any redesigning.

Simulations can test small-scale and large-scale architecture decisions. Simulations can also test different communication approaches and protocols. Generally, the manner in which time is simulated is also addressed so as to attempt to emulate real-world effects resulting from unexpected processing and communication delays. Many simulation parameters may be tuned to produce a simulator that simulates a targeted distributed system to a desired level of accuracy.

SUMMARY

Distributed system simulation is enhanced by extending the simulation window. In a described implementation, the simulation window extension is facilitated with a slow message relaxation scheme. For example, when the simulation window is extended, a greater number of unscheduled events are produced each round. Consequently, a greater number of such unscheduled events are slow unscheduled events that arrive with a timestamp that is prior to (e.g., less than) the local time of a logical process participating in the simulation. To ameliorate the problem of slow unscheduled messages and their corresponding slow unscheduled events, the current logical time of the receiving logical process is substituted for the original timestamp of the slow unscheduled event to transform it into a punctual unscheduled event. Punctual unscheduled events may be processed by the logical process similarly to scheduled events by adding them to an event queue of the logical process. The extended width of the relaxed simulation window may be adjusted during a simulation responsive to runtime parameter(s).

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. Moreover, other method, system, scheme, apparatus, device, media, procedure, API, arrangement, etc. implementations are described herein.

BRIEF DESCRIPTION OF THE DRAWINGS

The same numbers are used throughout the drawings to reference like and/or corresponding aspects, features, and components.

DETAILED DESCRIPTION

Example Protocol and Architecture

An example simulation target is a large-scale distributed protocol simulation that may involve up to millions of protocol instances. It would be difficult for a single machine to meet the demanding computation and memory requirements, so a distributed architecture is applied to the targeted simulation scenario. By way of example only, a commodity personal computer (PC) cluster may be employed to run the simulations.

Figure 1:
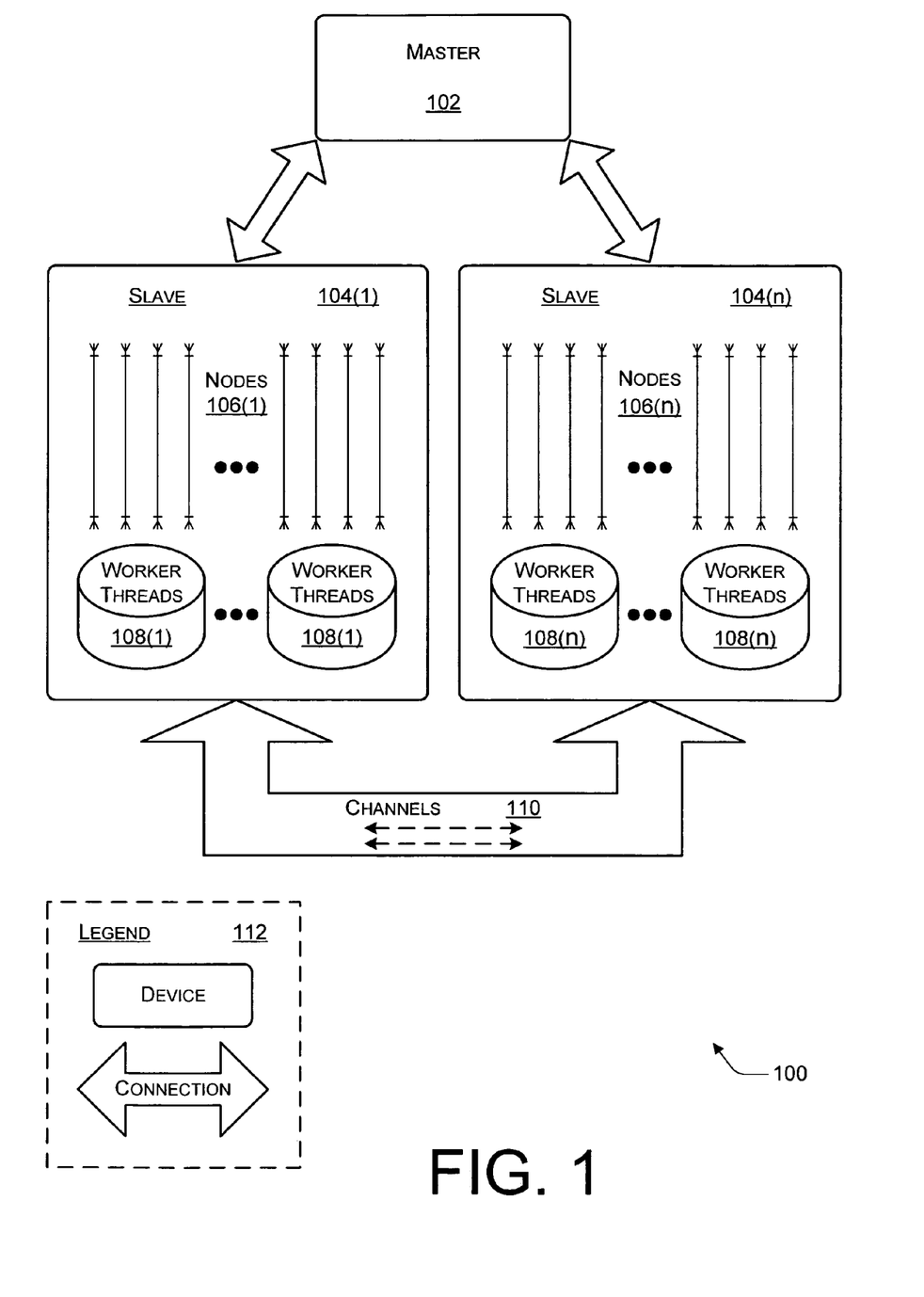
FIG. 1 is a block diagram of an example two-level architecture that may be applied to simulation scenarios.

FIG. 1 is a block diagram of an example two-level architecture 100 that may be applied to simulation scenarios. As illustrated, architecture 100 includes a master 102, multiples slaves 104, nodes 106, worker threads 108, and channels 110. A legend 112 is also pictured. As indicated by legend 112, the rectangular boxes represent at least one device, and the arrows represent one or more connections. An example device 302 is described herein below with particular reference to FIG. 3.

In a described implementation, master 102 and slaves 104 may each be implemented with at least one device. There is typically a single master 102. However, multiple masters 102 may alternatively be implemented if useful due to processing and/or communication bandwidth demands, due to fault-tolerancy/redundancy preferences, and so forth. A slave 104(1) and a slave 104(n) are specifically illustrated. However, "n" total slaves, where n is an integer, may actually be implemented with architecture 100.

Each slave 104 usually has a number of worker threads 108. Threads 108(1) perform work on slave 104(1), and threads 108(n) perform work on slave 104(n). Multiple nodes 106 are simulated on each slave 104. Nodes 106(1) are simulated on slave 104(1), and nodes 106(n) are simulated on slave 104(n). To harness any available hardware parallelism (e.g., symmetric multiprocessing (SMP), hyper-threading, etc.) capabilities, multiple worker threads 108 are employed. Each worker thread 108 is responsible for a sub-group of nodes 106.

There is a respective communication connection between master 102 and each respective slave 104. Each individual slave 104 also has a communication connection to other slaves 104 to establish communication channels 110. Channels 110 for each pair of communicating nodes 106 may be multiplexed in the pre-established connections between slave 104 devices.

The term "node" (e.g., a node 106) is used herein to denote one simulated instance. In a described implementation, on each physical device or machine, instead of embodying each node 106 in a run-able thread, an event driven architecture is adopted. Events, which usually involve messages and/or timers, of all nodes 106 (e.g., of a given slave 104) are aligned in an event queue in a timestamp order. In a described implementation, there is one logical process (LP) associated with nodes 106 on each slave 104.

In the illustrated case, there are "i" LPs, with i=n. $LP_i$'s local clock, denoted as $LVT_i$, is considered and/or set equal to the timestamp of the head event in its event queue. Master 102 coordinates the LPs of slaves 104. Thus, a two-level architecture 100 is created as shown in FIG. 1. The local clock $LVT_i$, an event queue, timestamps, etc. are shown in the logical architecture 200 of FIG. 2.

Figure 2:
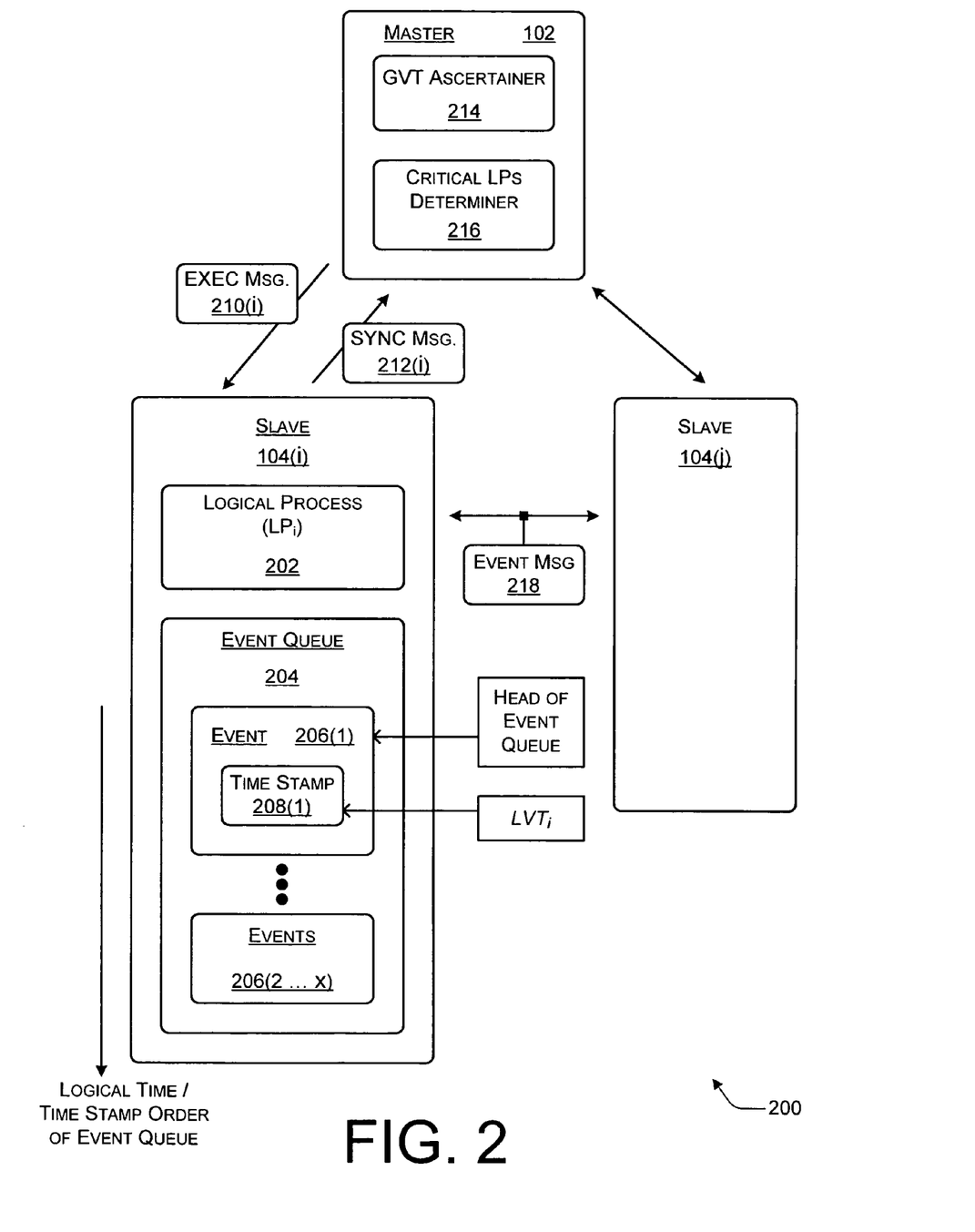
FIG. 2 is a block diagram of the example two-level architecture from a logical perspective.

FIG. 2 is a block diagram of the example two-level architecture from a logical perspective. Logical architecture 200 includes master 102, slave 104(i), and slave 104(j). Logical components of logical architecture 200 are illustrated and described with regard to slave 104(i). However, the illustrated and described components may be present at each slave 104. These logical components of logical architecture 200 include an LP 202, an event queue 204, and multiple events 206. Event 206(1), which is the head event in event queue 204, includes a time stamp 208(1). Event queue 204 is shown with "x" events 206, where x is some integer.

After its generation in $LP_i$, a time-stamped event e is delivered as an event message 218 to its destination $LP_j$ and merged to the local event queue of destination $LP_j$. The event's timestamp $TS_e$ is calculated by $TS_e=LVT_i+d_e$, where $d_e$ is the latency of the event, as specified by a network model. The globally minimum value of d, i.e. the global lookahead, is denoted as δ.

With a described protocol implementation, execution of the events in chronicle order is attempted, if not guaranteed. Each LP processes safe events, which are defined to be those events whose timestamps fall in [GVT, GVT+δ], where GVT is the globally lowest or least clock among LPs. The GVT is ascertained at master 102 by GVT ascertainer 214 using the LVTs from LPs 202 of slaves 104. The critical LPs are the subset of the total LPs that have safe events for a given GVT. The simulation is conducted in rounds. The critical LPs for each round are determined at master 102 by critical LP determiner 216.

At the beginning of a round, every LP reports to the master its LVT, and the master computes the GVT and the critical LPs for the current round. The master then informs those critical LPs of the GVT in an EXEC message 210. Accordingly, the critical LPs start to run till GVT+δ. The execution of the current round not only changes the LVTs of the critical LPs themselves, but also generates events, as represented by event message 218, that can change the LVTs of other LPs as well. Thus, after finishing a round of execution, a critical LP sends the master a SYNC message 212, which includes its new LVT and a list SE recording the timestamps of the events it has sent to any other LPs. This allows the master to compute both the GVT and the critical LPs for the next round.

However, the reception of an EXEC message alone from the master is only a necessary but not a sufficient condition for safe event execution. This is because an event from $LP_i$ to $LP_j$ may arrive later than the EXEC message from the master, which is common in a network environment where the triangle inequality no longer holds. Consequently, the master can act as a gate-keeper to track the number of events for LPs. The master tells $LP_i$ in the EXEC message the number of safe events that $LP_i$ must wait to receive before executing any of the events. The count of safe events for $LP_i$ can be calculated by $$C_i = \sum_{j \in N} M_{j,i},$$

where $M_{j,i}$ is the number of events sent from $LP_j$ to $LP_i$ with timestamp in [GVT, GVT+δ]. This is why the SYNC message 212(j) (not explicitly shown) from $LP_j$ is configured to contain the timestamps of the event messages 218 it has sent to other LPs in the form of the recorded listing SE of such sent events.

Establishing this partial barrier is efficient in that only the critical LPs need to be involved in the synchronization, which is separated from simulated data transmission. Event messages 218 are directly transmitted to their destinations and are processed as soon as chronologically permissible, which is made very likely, if not effectively guaranteed, by the control information maintained by the master. This approach results in the number of messages being proportionate to O(N).

There is sometimes a concern that availability is sacrificed when a centralized architecture, such as a master-slave architecture, is used. It is argued herein that it is an illusion that availability is improved without a centralized controlling master. For example, in all known previous proposals, the crash of any one of the LPs halts the simulation. Thus, a master-slave architecture does no worse. In fact, in a described implementation, the protocol is augmented to be fault resilient. If a master crashes, a new master can be created and its state can be reconstructed from the slaves. If a slave crashes, the master eliminates it from the slaves and allows the rest to continue with the simulation. The latter case is especially acceptable in peer-to-peer (P2P) overlay simulations, for example, because eliminating an LP and its associated nodes is as if a group of nodes have left the system.

Example Device for Distributed System Simulation

Figure 3:
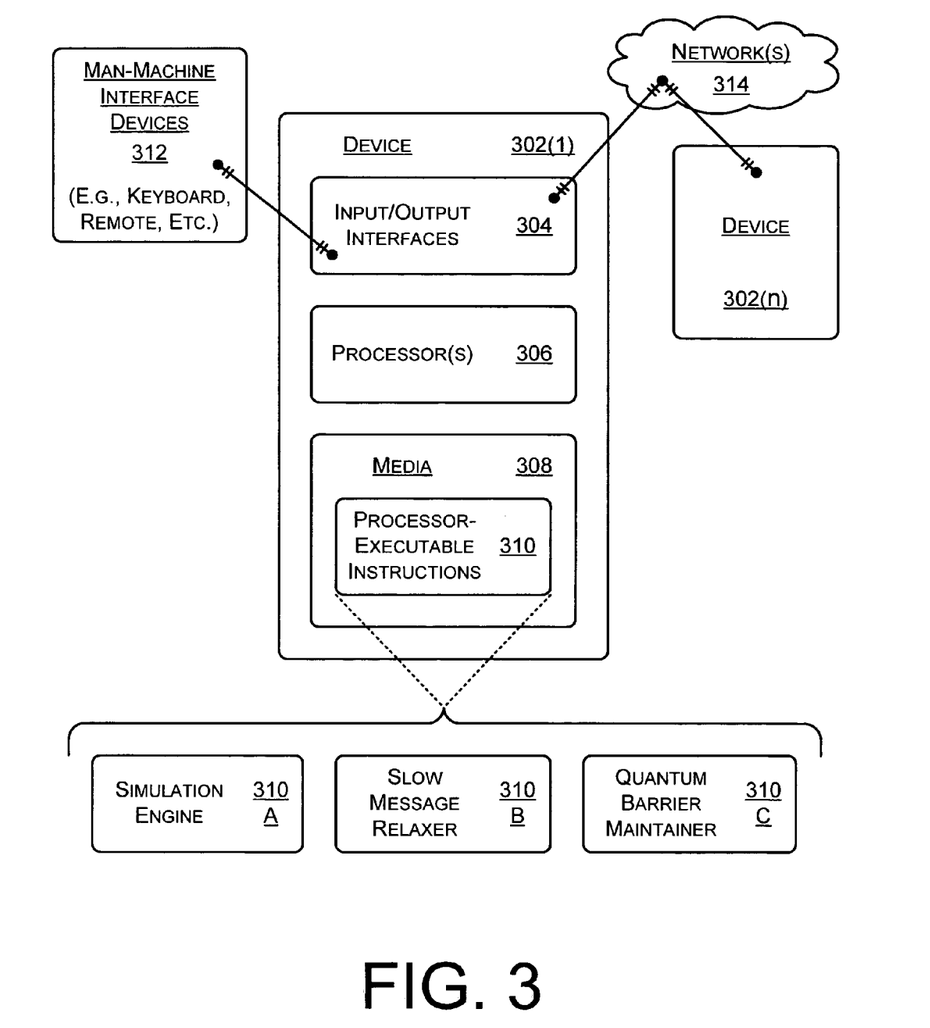
FIG. 3 is a block diagram of an example device that may be employed in conjunction with the simulation of distributed systems.

FIG. 3 is a block diagram of an example device 302 that may be employed in conjunction with the simulation of distributed systems. For example, device 302 may be used during the development of a distributed system and/or a protocol, may be used to perform a simulation, and so forth. Device 302 may, for instance, perform the actions of flow diagrams 500, 700, and 800 as described herein below with particular reference to FIGS. 5, 7, and 8, respectively.

In a described implementation, multiple devices (or machines) 302 are capable of communicating across one or more networks 314. As illustrated, two devices 302(1) and 302(n) are capable of engaging in communication exchanges via network 314. Although two devices 302 are specifically shown, one or more than two devices 302 may be employed, depending on implementation. Each device 302 may function as a master 102 or a slave 104 (of FIG. 1).

Generally, device 302 may represent a server device; a storage device; a workstation or other general computer device; a router, switch, or other transmission device; a so-called peer in a distributed P2P network; some combination thereof; and so forth. In an example implementation, however, device 302 comprises a commodity PC for price-performance reasons. As illustrated, device 302 includes one or more input/output (I/O) interfaces 304, at least one processor 306, and one or more media 308. Media 308 includes processor-executable instructions 310. Although not specifically illustrated, device 302 may also include other components.

In a described implementation of device 302, I/O interfaces 304 may include (i) a network interface for communicating across network(s) 314, (ii) a display device interface for displaying information on a display screen, (iii) one or more man-machine interfaces, and so forth. Examples of (i) network interfaces include a network card, a modem, one or more ports, and so forth. Examples of (ii) display device interfaces include a graphics driver, a graphics card, a hardware or software driver for a screen or printer, and so forth. Examples of (iii) man-machine interfaces include those that communicate by wire or wirelessly to man-machine interface devices 312 (e.g., a keyboard, a mouse or other graphical pointing device, etc.).

Generally, processor 306 is capable of executing, performing, and/or otherwise effectuating processor-executable instructions, such as processor-executable instructions 310. Media 308 is comprised of one or more processor-accessible media. In other words, media 308 may include processor-executable instructions 310 that are executable by processor 306 to effectuate the performance of functions by device 302.

Thus, realizations for distributed system simulation may be described in the general context of processor-executable instructions. Generally, processor-executable instructions include routines, programs, applications, coding, modules, protocols, objects, interfaces, components, metadata and definitions thereof, data structures, application programming interfaces (APIs), etc. that perform and/or enable particular tasks and/or implement particular abstract data types. Processor-executable instructions may be located in separate storage media, executed by different processors, and/or propagated over or extant on various transmission media.

Processor(s) 306 may be implemented using any applicable processing-capable technology. Media 308 may be any available media that is included as part of and/or accessible by device 302. It includes volatile and non-volatile media, removable and non-removable media, and storage and transmission media (e.g., wireless or wired communication channels). For example, media 308 may include an array of disks for longer-term mass storage of processor-executable instructions, random access memory (RAM) for shorter-term storage of instructions that are currently being executed, link(s) on network 314 for transmitting communications, and so forth.

As specifically illustrated, media 308 comprises at least processor-executable instructions 310. Generally, processor-executable instructions 310, when executed by processor 306, enable device 302 to perform the various functions described herein, including those actions that are represented by the pseudo code examples presented herein below as well as those that are illustrated in flow diagrams 500, 700, and 800 (of FIGS. 5, 7, and 8, respectively) and those logical components illustrated in logical architecture 200 (of FIG. 2).

By way of example only, processor-executable instructions 310 may include all or part of a simulation engine 310A, a slow message relaxer 310B, and/or a quantum barrier maintainer 310C. Each may include functional aspects for a master 102 and/or a slave 104.

Simulation Window Extension

The barrier model, which performs the simulation in rounds, becomes increasingly inefficient as the number of devices in the cluster increases. In a described implementation, performance is increased by reducing the number of barriers in a given simulation run. This enhancement is termed herein "Slow Message Relaxation" (SMR). SMR essentially extends the simulation window from [GVT, GVT+δ) to [GVT, GVT+R), where R is the relaxation window. As a result, for each barrier period, more than the number of safe events are executed in a round.

Figure 4:
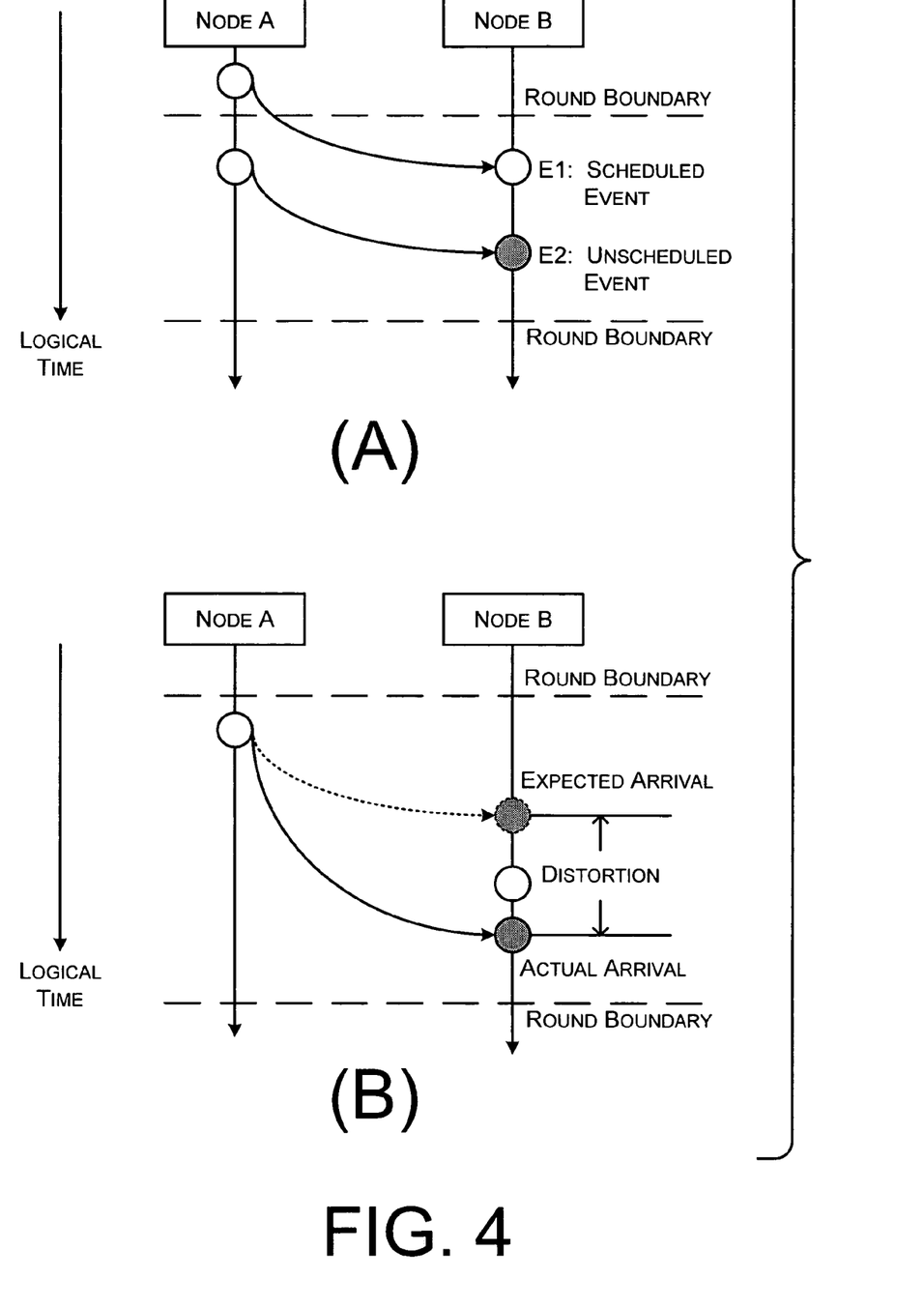
FIGS. 4A and 4B are graphs that illustrate unscheduled events and the possible distortion that may result from unscheduled events, respectively.

There are two consequences of extending the simulation window and executing non-safe events. In a described implementation, these two consequences are quantum barrier maintenance and SMR. These two consequences are addressed further herein below after unscheduled events are introduced and described with particular reference to FIGS. 4A and 4B.

FIGS. 4A and 4B are graphs that illustrate unscheduled events and the possible distortion that may result from unscheduled events, respectively. In both of FIGS. 4A and 4B, logical time advances from the top of the graph toward the bottom of the graph. Each graph includes a node A and a node B. Node A is generating events that are sent to node B for processing. Round boundaries are illustrated with long dashed lines.

As shown in FIG. 4A, event E1 is generated in a previous round to be processed in the current round. Thus, event E1 is a scheduled event because it is to be processed in a round that is different from the one in which it is generated. Event E2 is generated in the current round and is to be processed in the current round. Thus, event E2 is an unscheduled event. Unscheduled events are events that neither the master nor node B (nor node A) has previously made any provision to properly account for them. This accounting failure can reduce the certainty and precision of the simulation. Quantum barrier maintenance, as described herein below, addresses this concern.

As shown in FIG. 4B, unscheduled events can introduce distortion. Node A generates an unscheduled event for processing by node B within the current round. The unscheduled event has an expected arrival time. However, the event message may not arrive in a timely manner. In other words, the actual arrival time is after the expected arrival time. The delay period introduces distortion that threatens to seriously impact the efficiency and/or accuracy of the simulation. SMR, as described herein, addresses this concern.

As noted above, one consequence of the simulation window extension is the heightened relevancy of imposing or maintaining a quantum barrier. Although the typical scheduled events that are generated in the previous rounds can still be tracked, other events that are generated on the fly are also produced. As shown in FIG. 4A, some of these on-the-fly events (e.g., event E1) become scheduled events for future rounds. On the other hand, others have timestamps within [GVT+δ, GVT+R), and these are therefore intended to be processed in the current round. Such events (e.g., event E2) are referred to as unscheduled events. Quantum barrier maintenance, or simply the quantum barrier technique, ensures that most (if not guarantees that all) unscheduled events are processed in the current round. This is particularly tricky because the total number of unscheduled events is unknown a priori. The quantum barrier technique is described further herein below in the section entitled "TRAVERSING RUNTIME SPANNING TREES".

As noted above, another consequence of the simulation window extension in a described implementation is SMR. Scheduled events can be guaranteed to be executed in chronicle order and in accordance with their associated timestamps. But there is no such guarantee for an unscheduled event. For example, it is possible that an LP receives an unscheduled event whose timestamp is behind the receiving LP's current clock. Such an unscheduled message is termed herein a slow unscheduled message. A conventional approach to slow messages is to avoid the handling of them by rolling back time such that each slow unscheduled message becomes merely a punctual unscheduled message. In contrast, in an implementation described below in the section entitled "SLOW MESSAGE RELAXATION (SMR)", slow unscheduled messages are handled without rolling back time via the described SMR scheme.

Slow Message Relaxation (SMR)

With SMR, a slow unscheduled message's timestamp is replaced with the current clock, and then the message is processed as a punctual unscheduled message. The current clock substitution of the slow message's timestamp works because, from the simulated protocol point of view, it is as if the "slow" message had suffered from some extra delay in the network. A properly designed distributed protocol is typically capable of handling any network-jitter-generated abnormality. Thus, replacing a slow message's timestamp with the current clock is termed "Slow Message Relaxation" or SMR herein.

As is explained in greater detail herein below in a subsection entitled "Analysis of SMR Effects", by taking advantage of the fact that a distributed protocol is usually inherently able to tolerate network uncertainty, the relaxation window can be significantly wider than what the conventional lookahead window can allow. In fact, the relaxation window can often be greater at the range of hundreds of times wider. On the other hand, in such a wider simulation window there is a noticeable increased percentage of slow messages, and the use of the roll-back approach results in practically unacceptable performance.

Of course, if the time relaxation mechanism is used too aggressively, the simulation results can be severely distorted.

are generated. Those events with timestamps in the current round are considered unscheduled events, and those events whose timestamps fall across rounds (e.g., that fall into the next round) are the scheduled events. If an unscheduled event falls behind the current clock of the destination LP upon its arrival, the unscheduled event is turned into a slow unscheduled message, and its latency is changed. Specifically, the original timestamp of the slow unscheduled message is replaced with the current clock of the destination LP. In a described implementation, the current clock of the destination LP is equivalent to the timestamp of the head event in the event queue of the destination LP (as illustrated in FIG. 2).

SMR Protocol

The pseudo code for the SMR protocol evolves from the basic protocol. In a described implementation, it is written in an asynchronous message-handling fashion. As reproduced below, the example pseudo code includes 24 lines, and it is separated into two parts. The first part includes lines [1]-[18], and it is directed to slave LPs. The second part includes lines [19]-[24], and it is related to the functions of the master.

The first part of the example pseudo code for the slave LPs is further subdivided into three subparts. The first subpart includes lines [1]-[8] and is directed to general event queue handling. The second subpart includes lines [9]-[13] and addresses reception of EXEC messages from the manager/master. The third subpart includes lines [14]-[18] and addresses reception of external events.

The 24 lines of pseudo code are presented below:

```
[1]   Run:
[2]      while Queue.head.ts < GVT_UB do
[3]         get the head event and remove it from Queue
[4]         LVT_i := max(LVT_i, Queue.head.ts);
                                   // ensure that time never goes back
[5]         process the head event, for each event it generates
[6]            deliver the event to its destination LP_j and update M_{i,j}
[7]         send SYNC message to the master, with M_i attached
[8]      end.
[9]   OnExecMsg(GVT, GVT_UB, C_i):     // the EXEC message from manager
[10]     LVT_i := GVT;                 // update logical time
[11]     if all (Ci) scheduled events have been received and Queue.head.ts <
         GVTUB then
[12]        Run;                       // execute those events that have arrived
[13]     end.
[14]  OnReceiveExternalEvent(event):
[15]     Queue.insert(event);
[16]     if all (C_i) scheduled events have been received and event.ts < GVT_UB
         then
[17]        Run;
[18]     end.
[19]  OnSyncMsg(M_i):                  // SYNC message from LP_i
[20]     merge M_i into M
[21]     if all the events in [GVT, GVT_UB) have been received and processed
         then
[22]        calculate the new GVT, C and R, according to the M
[23]        send EXEC message to all LPs
[24]     end.
```

Hence, the relaxation window is carefully selected. To further ensure proper performance, the width of the relaxation window can be adaptive to the simulation run. This analysis is presented further herein below in the subsection entitled "Analysis of SMR Effects".

As described herein above with particular reference to FIGS. 4A and 4B, during a simulation many on-the-fly events Like the basic protocol, the LP is scheduled to run by the EXEC message (lines [9]-[13]) that is received from the master. The EXEC message contains GVT, $GVT_{UB}$, and $C_i$. GVT is the minimum value of LVTs, and $GVT_{UB}$ represents GVT+R, with R being the extended or relaxed simulation window width. $C_i$ is the number of scheduled events of $LP_i$. $C_i$ is calculated by $$C_i = \sum_{j \in N} M_{j,i},$$

where $M_{j,i}$ is the number of events sent from $LP_j$ to $LP_i$ with timestamp in [GVT, $GVT_{UB}$]. If all the scheduled events are received, the LP can start executing the events till $GVT_{UB}$ (lines [1]-[8]).

There is a procedure for handling the reception of external events (lines [14]-[18]). When an unscheduled event arrives, with a timestamp that is less than $GVT_{UB}$ (line [16] above), it is processed immediately. In other words, the punctual unscheduled event is added to the event queue, and the event is handled when it is present at the head of the event queue. When all the events in the execution window are processed, the $LVT_i$ and $M_i$ for the end of the current round are sent back to the master in an individual SYNC message.

Upon receiving the SYNC messages, the master is able to calculate a new GVT and $C_i$. When the master determines that all of the unscheduled events have been received and processed, it proceeds to the next round. The determination as to when all unscheduled events have been processed is addressed with regard to the quantum barrier maintenance implementation, which is described further herein below.

An example SMR scheme for substituting local LP time as the timestamp for slow unscheduled events is described below with particular reference to FIG. 5. A mechanism for automatically deriving an appropriate relaxed window width R for each round is presented afterwards in a subsection entitled "SMR Runtime Adaptation".

Figure 5:
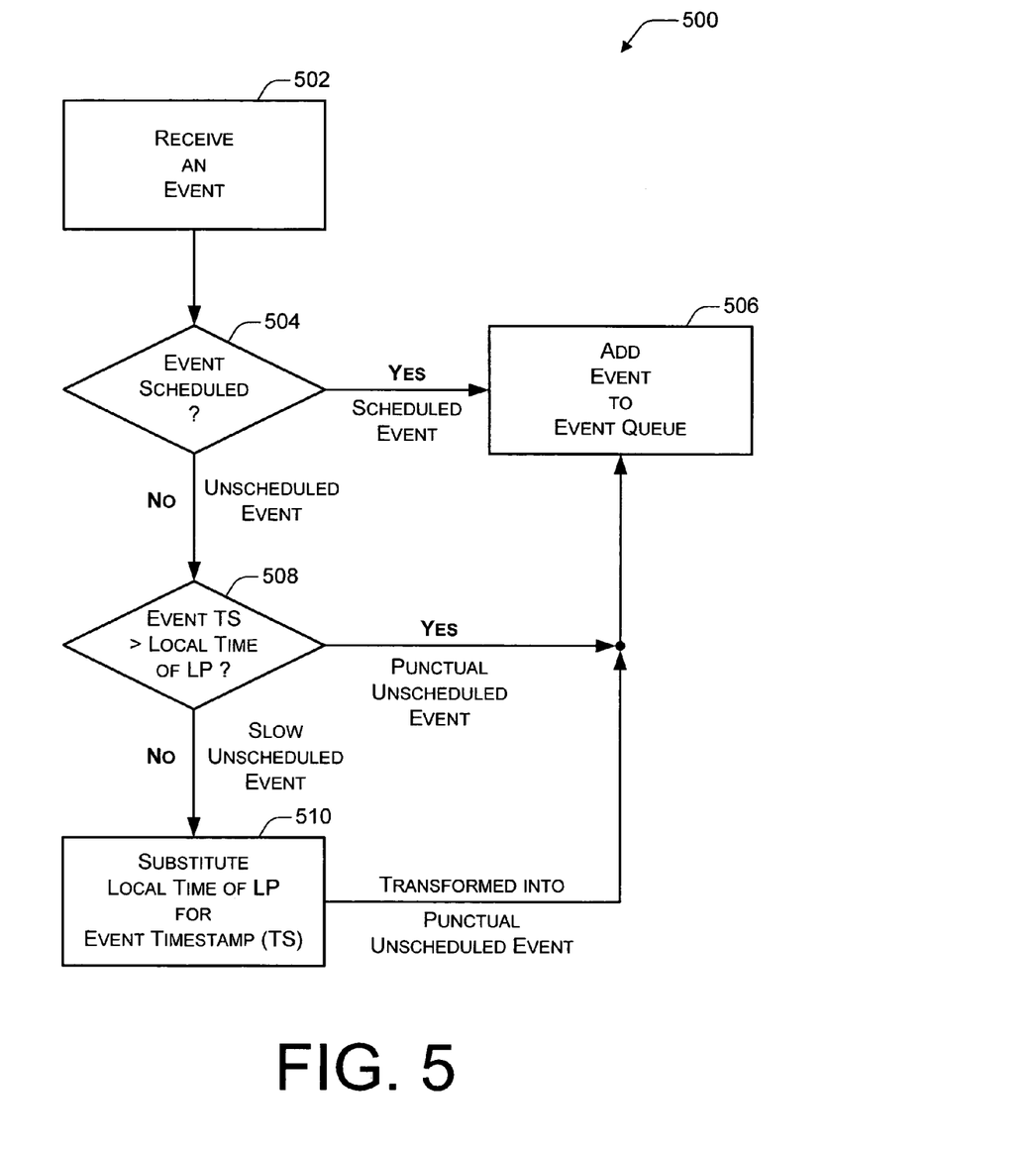
FIG. 5 is a flow diagram that illustrates an example of a method for slow message relaxation.

FIG. 5 is a flow diagram 500 that illustrates an example of a method for slow message relaxation. Flow diagram 500 includes five (5) blocks 502-510. Although the actions of flow diagram 500 may be performed in other environments and with a variety of hardware and software combinations, a device 302 that is described herein above with particular reference to FIG. 3 may be used to implement the method of flow diagram 500. The logical architecture 200 of FIG. 2 is referenced to further explain the method.

At block 502, an event is received. For example, an event message 218 corresponding to an event 206 may be received at an LP 202 from another LP. At block 504, it is determined if the received event is a scheduled event. For example, it may be determined if the received event 206 was created by the other LP in a previous round. For instance, LP 202 may check if event 206 was listed in an EXEC message 210(i) for the current round.

If the received event is determined to be a scheduled event, then at block 506 the event is added to the event queue. For example, scheduled event 206 may be inserted into event queue 204 at its chronological position. If, on the other hand, the received event is not determined to be a scheduled event (at block 504), then at block 508 the unscheduled event is analyzed from a temporal perspective.

At block 508, it is determined if the timestamp (TS) of the event is greater than the local time of the LP. For example, it may be determined if a timestamp 208 of the received unscheduled event 206 is greater than $LVT_i$. If so, then the unscheduled event is a punctual unscheduled event, and the punctual unscheduled event is added to the event queue at block 506. For example, punctual unscheduled event 206 may be inserted into event queue 204 at its correct chronological position based on its timestamp 208.

If, on the other hand, it is determined (at block 508) that the timestamp of the event is not greater than the local time of the LP, then the unscheduled event is a slow unscheduled event. At block 510, the local time of the LP is substituted for the timestamp of the event. For example, $LVT_i$ of LP 202 may replace the time stamp 208 of the received slow unscheduled event 206. Afterwards, the unscheduled event that has been transformed from a slow unscheduled event into a punctual unscheduled event is added to the event queue at block 506. For example, because the time stamp 208 is set equal to the local time of LP 202, the transformed unscheduled event 206 may be inserted at the head position of event queue 204.

SMR Runtime Adaptation

In this subsection, an appropriate SMR bound for the relaxed window width is described. The appropriateness of the SMR bound may be determined based on whether a statistically accurate performance results from the simulation, with statistically accurate being dependent on the desired accuracy. It might seem intuitively natural to set R as large as possible for optimal performance gain. Nevertheless, this tends not to be true.

Through numerous experiments and careful analysis, it has been discovered that the performance does not improve monotonously as R increases. One of the reasons for this is that network congestion causes packets to be dropped and thus retransmissions to occur in accordance with transmission control protocol (TCP), for example. Consequently, the adaptation of R can be performed responsive to run time parameters (e.g., the adapting of the relaxed window width R may take a cue from runtime measurement(s)).

The example pseudo code for adaptively adjusting the SMR window relaxation width R during runtime includes 15 lines [1]-[15]. These 15 lines are presented below:

```
[1]   CalculateNewR( ):
[2]      If (R_curr > T_min/2)                              // just in case T_min has changed
[3]         R_next := T_min/2
[4]         return R_next
[5]      s_curr := R_curr/ t_curr                           // calculate the speed of current
[6]      s_prev := R_prev/ t_prev                           // and previous rounds
[7]      r_s := (s_curr − s_prev)/(s_curr + s_prev)         // compute rate coefficient
[8]      If (R_curr > R_prev) D := 1                        // compute the directional coefficient
[9]      If (R_curr < R_prev) D := −1
[10]     If (R_curr = R_prev) D := 0
[11]     R_next := R_curr + T_step*r_s*D + τ                // compute new R for the next round
[12]     If (R_next > T_min/2)                              // check against T_min again
[13]        R_next := T_min/2
```

-continued

[14]     return $R_{next}$
[15] end.

The adaptation of R is performed at the master. The example above implements a hill-climbing algorithm that is carried out before each new round starts (e.g., at line [22] of the pseudo code presented in the preceding subsection). The call to the function CalculateNewR( ) defines the $R_{next}$ to be used in the next round. The value $R_{next}$ is broadcast to the slaves in the EXEC messages 210.

In the adaptation algorithm, $R_{curr}$ is the R value for the current round, and $T_{min}$ is a bound imposed by the application and is collected from the slaves. As is explained in the following subsection, $T_{min}/2$ is the bound that R is prevented from exceeding in certain implementations. In the pseudo code for the R adaptation algorithm above, lines [2]-[4] check if $T_{min}$ has changed, and they set $R_{next}$ without further computation to be within the maximum bound if $R_{curr}$ exceeds it.

Lines [5]-[6] compute $s_{curr}$ and $s_{prev}$, which are the simulation speeds in the current and previous rounds, respectively. The rate coefficient $r_s$ in line [7] is a signed value in the range $(-1, 1)$, and its absolute value reflects the rate of speed change in the recent rounds, relative to the raw simulation speed. An intuitive decision is that the adjustment is made more slowly as the optimal value of R is approached. The direction coefficient D in lines [8]-[10] is relevant because the improvement of speed (i.e., $s_{curr} > s_{prev}$) can be achieved by either positive or negative adjustment of R. The directional trend is continued if the speed is improved; otherwise, the direction is reversed.

Line [11] computes $R_{next}$. Here, $T_{step}$ is a constant, and $\tau$ is a random disturbing factor in the range of $[-T_{step}/3, T_{step}/3]$ to avoid a local minimum. It also serves the purpose of making the adaptation process active, especially in an initial stage.

The description of the relaxation window width R adaptation mechanism is presented above in terms of adapting R with respect to a performance goal. Users can define other adaptation metrics. Examples of alternative adaptation metrics include: percentage of slow messages, upper bound of extra delays, and so forth. The overall adaptation mechanism can be implemented in accordance with these alternative adaptation metrics and can adjust accordingly as well.

Analysis of SMR Effects

In certain described implementations, SMR increases the simulation parallelism by reducing the number of barrier operations for a given simulation. However, a net effect of SMR is that some random messages are subject to some random extra delays. By themselves, properly designed distributed protocols typically handle any network-jitter-generated abnormality. Nevertheless, if there are too many slow messages and, more importantly, if application logics are significantly altered, then the simulation results may be severely distorted. Hence, it is important to understand the effects of SMR.

Although SMR may be implemented generally, the context of this analysis is to accelerate the simulation of very large-scale P2P networks. As demonstrated below, setting a correct bound ensures statistically correct results while achieving appreciable simulation accelerations. The following analysis is particularly pertinent to the so-called structured P2P networks. These structured P2P networks are often called DHT (for distributed hash table) networks because a collection of widely distributed nodes (e.g., across the entire Internet) self-organize into a very large logical space (e.g., on the order of 160 bits). Although implementations of these networks may differ, the protocols for them usually depend on the correct execution of timer logics as the presence or absence of other network nodes is determined, periodically verified, and so forth.

Let $T_{timeout}$ be the timer interval for these determinations, verifications, and so forth. The firing and timeout of a timer are two distinct events. It is apparent that these two events cannot be in the same simulation round; otherwise, they may be simulated back-to-back without waiting for the action associated with the firing to have its effect. Thus, we derive $R < T_{timeout}$. To indicate how much relaxation this can provide, it is noted that $T_{timeout}$ can be on the order of seconds (or even minutes). In contrast, a lookahead that is defined by a network model is often in the range of tens of milliseconds. With typical configurations, this means that the affordable window width can be several hundred times wider than that of a typical lookahead.

The problem of a slow message, in terms of the timer logic, is that it can generate a false time-out. To understand this better, the delay bound of slow messages is analyzed first. With reference to FIG. 4B, if at $t_0$ an event generates a message whose delay is d, then the message has a timestamp of $t_0+d$. If $t_0+d$ is greater than the ending time of the current simulation round, the message becomes a scheduled event in some future round and there is no extra delay. Hence, the maximum extra delay happens when $t_0$ equals the beginning of a round and upon arrival at the target node where the clock is one tick shorter than R: the extra delay is thus R−d.

The following conclusion can therefore be drawn—Bound 1: The upper bound of extra delay of unscheduled events is R−d, where d is the minimum network delay.

A two-step message sequence is also contemplated: by way of example, node A sends a message to node B, and node B sends a second message back to node A as a response. If both messages are slow messages, then they are both within the same round; hence, the extra delay does not exceed R−2d. If one of these two messages is a slow message, then the extra delay does not exceed R−d. If both are not slow messages, then no extra delay occurs.

As a result, another upper bound of extra delay of slow messages can be determined as follows—Bound 2: The upper bound of extra delay of a two-message sequence is R−d.

Selection of R to avoid false time-outs is addressed next. The following hypothetical is assumed: node A sends a request to node B and starts a timer with the interval $T_{timeout}$, and node A then enters a waiting state. The round trip between node A and node B is $T_{round}=2d$. If $R \leq d$, there is no distortion. Thus, the case when $R > d$ is the focus. First, as a reasonable setting, $T_{timeout}$ is set larger than $T_{round}$ in order to keep the timeout logic working with normal network delays. Based on the Bound 2 (i.e., the case of the two-step sequence $A \rightarrow B \rightarrow A$), if $T_{timeout} > T_{round} + (R-d)$, then distortion does not lead to a false timeout. However, if $T_{round} < T_{timeout} \leq T_{round} + (R-d)$, a false timeout may occur.

From $T_{timeout} > T_{round} + (R-d)$ and $T_{round} = 2d$, the following is derived:

$$R < T_{timeout} - d.$$

Because $T_{timeout} > T_{round} = 2d$, or equivalently, $d < T_{timeout}/2$, it follows that $R < T_{timeout}/2$ is a sufficient condition. Thus, the following distortion related parameter is derived:

$$R < T_{timeout}/2.$$

As a result, if R is set to satisfy $R < T_{timeout}/2$, then distortion does not break the timer logic for request-response protocols. Other timer logics can be analyzed analogously.

The above analysis is related to DHT logics. DHT applications issue lookups, which may take O(logN) steps. At issue is how one ensures that there are no false lookup timeouts. In fact, the 2-step message bound can be extended to a k-step message sequence. When k>3, a k-step message sequence can be decomposed as ⌈k/2⌉ two-step message sequences, where the last combination may have only one message. The application programmer typically estimates a reasonable one-step network latency, adds some leeway, and times a conservative value of the total number of hops (e.g., 2 log N for a reasonable N), and finally arrives at a lookup time-out setting. To be consistent, the two-step request-response timeout value $T_{timeout}$ should also be used as a base to set the lookup timeout. Thus, $R < T_{timeout}/2$ also prevents false lookup timeouts.

As is apparent from the analysis in this subsection, although the DHT protocol is very complex, the bound $R < T_{timeout}/2$ is generally sufficient to keep the application logic as close to reality as what an undistorted simulation might achieve.

Traversing Runtime Spanning Trees

Implementations as described herein for traversing runtime spanning trees may be employed in many different scenarios. They are particularly applicable to traversing runtime spanning trees in scenarios that involve a distributed apparatus. They can reduce communication overhead between and among different devices of a distributed apparatus while still ensuring that events are properly accounted for during execution of an operation with the distributed apparatus. For example, a central controller can ascertain if all relevant events have been addressed without being directly informed of the total number of events or the origin of events that are created. By way of example only, the operation may be a distributed system simulation, the distributed apparatus may be the two-level architecture 100 (of FIG. 1), and the central controller may be the master 102.

As discussed herein above with particular reference to FIG. 2, logical processes (LPs) 202 receive a message (e.g., an EXEC message 210) from master 102 at the start of each round. With EXEC message 210, master 102 informs LP 202 of the scheduled events M that are to occur within the coming round. Consequently, LP 202 and master 102 can ensure that the scheduled events are processed within the intended round. However, as illustrated in FIG. 4A, there is no comparable advance knowledge of unscheduled events that are to be processed within the round in which they are created.

If unscheduled events are not processed within the intended round, then the simulation can be adversely affected or even rendered useless. Accordingly, example schemes and mechanisms for ensuring, if not guaranteeing, that unscheduled events are properly accounted for (e.g., processed) within the intended round are described in this section.

The importance of tracking unscheduled events increases as the width of the simulation window is extended because the number of unscheduled events increases. Thus, an issue relating to the extension of the simulation window is to ensure that the unscheduled events, which are generated on-the-fly, are received and processed within the current round. In other words, implementing a quantum barrier relates to ensuring that the completeness of events within the barrier window [GVT, GVT+R] is achieved.

Each (unscheduled) event that is created may be considered a node, and the derivation relationship between events may be considered a link between a parent node and a child node. This analysis produces or establishes a runtime spanning tree of events for a given round. The leaves represent events that do not generate any unscheduled events. In other words, events that are not parents form the leaves of the runtime spanning tree.

If the processing or execution of an event is defined as the access to the event node, the quantum barrier issue can be abstracted to be a distributed traversal algorithm of a spanning tree that is generated at runtime. Due to the lack of a global state, it seems that the tree traversal problem in a distributed system is likely more difficult as compared to in a centralized environment.

Figure 6:
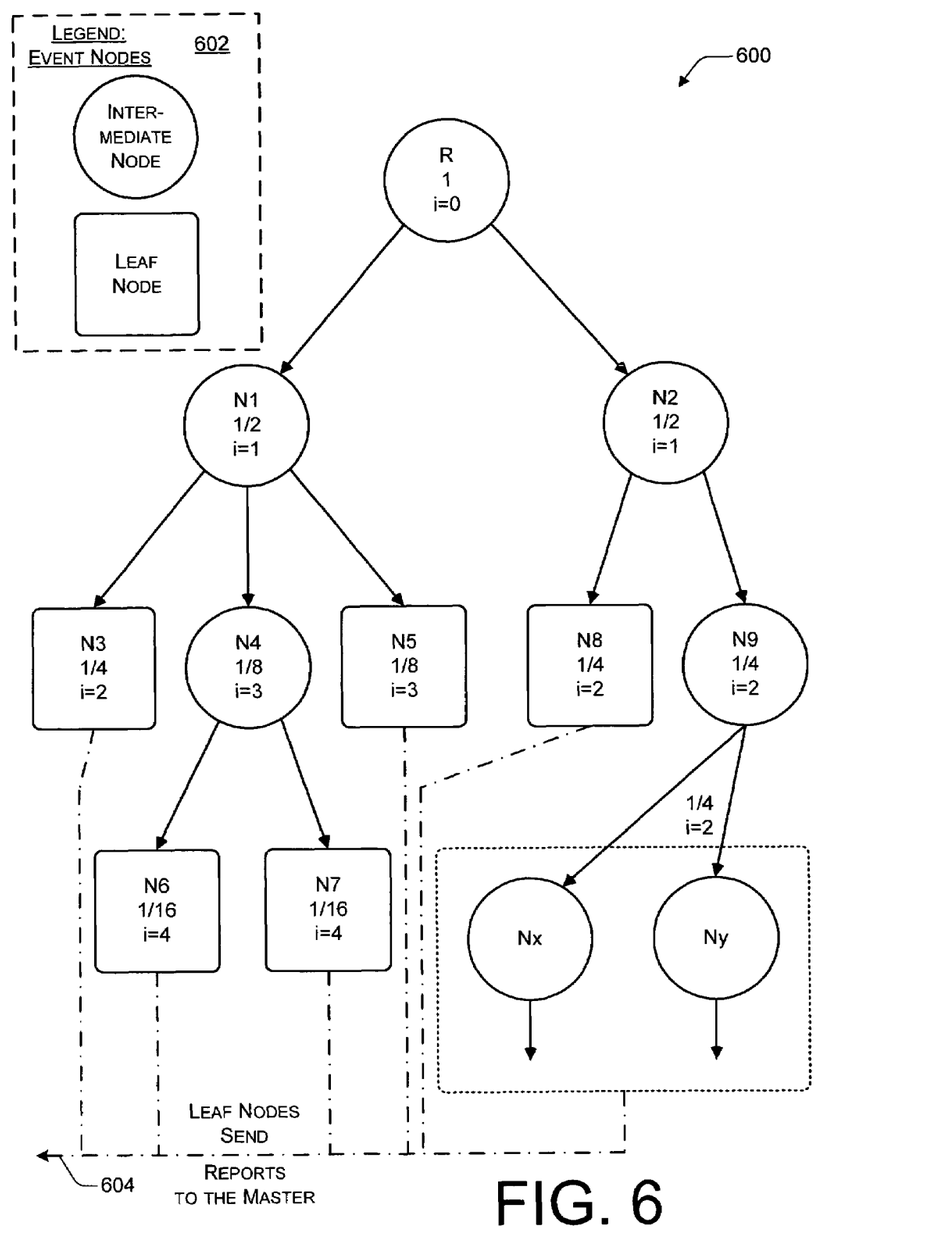
FIG. 6 is a block diagram of an example runtime spanning tree that may be used in conjunction with the simulation of distributed systems.

FIG. 6 is a block diagram of an example runtime spanning tree 600 that may be used in conjunction with the simulation of distributed systems. As indicated by legend 602, event nodes that are represented by circles are intermediate nodes, and event nodes that are represented by squares are leaf nodes. As illustrated, example runtime spanning tree 600 includes one (1) root node R, nine (9) "standard" nodes N1-N9, and two extra nodes Nx and Ny. The two extra nodes Nx and Ny indicate that an actual runtime spanning tree 600 may be larger (and probably will be much larger) than that depicted in FIG. 6.

Root node R spawns nodes N1 and N2. Thus, nodes N1 and N2 are the child nodes of root node R. Node N1 spawns nodes N3, N3, and N5. Node N4 spawns nodes N6 and N7. Node N2 spawns nodes N8 and N9. Node N9 spawns the additional nodes Nx and Ny. As indicated by their circular appearance, nodes N1, N2, N4, N9, Nx, and Ny are intermediate nodes. Nodes N3, N5, N6, N7, and N8 are leaf nodes.

A relatively naïve approach to traversing a tree is as follows. For a given tree, the sum of the fan-out degree of all nodes is equal to the number of tree nodes plus 1. Thus, when a node is accessed, its fan-out degree (i.e., the number of its children) is submitted to a central repository. Similarly, the number of processed events may be reported to the central repository. The barrier is reached when these two numbers are equal. Unfortunately, this approach is not optimal.

The tree traversal terminates when all of the leaf nodes are accessed. A difficulty is that the total number of leaf nodes that exist is unknown in such a highly dynamic tree. This difficulty is ameliorated, if not remedied, by using tokens.

A first token-based approach is as follows. The central repository gives the root of a tree a token with a pre-selected root value (e.g., one). Iteratively, whenever an intermediate or non-leaf event generates child events, the intermediate event passes a split or partial token to each child. The value of the split token is the current token's value divided by the number of children. Thus, if a parent node has a partial token equal to ⅓ and three child events, the three child event nodes are assigned token values of ⅑ apiece. The leaf events report their token values back to the central repository. When/if the sum of these reported leaf tokens equals the pre-selected value (e.g., one), the central repository knows that the spanning tree traversal—and therefore the execution of all the corresponding events—is complete.

The first token-based approach has two practical problems. First, the fan-out of an event cannot be known a priori. In order to know the total number of descendant events, the descendant events have to be buffered before being delivered to their destinations LPs. This is not particularly efficient. Second, fraction-based tokens have an inherent limitation in precision and are not especially scalable. A second token-based approach that addresses these two practical problems is described herein below prior to the description of FIG. 8 and in conjunction with the description of FIG. 8. However, an overall method for implementing a quantum barrier is described first with particular reference to FIG. 7.

Figure 7:
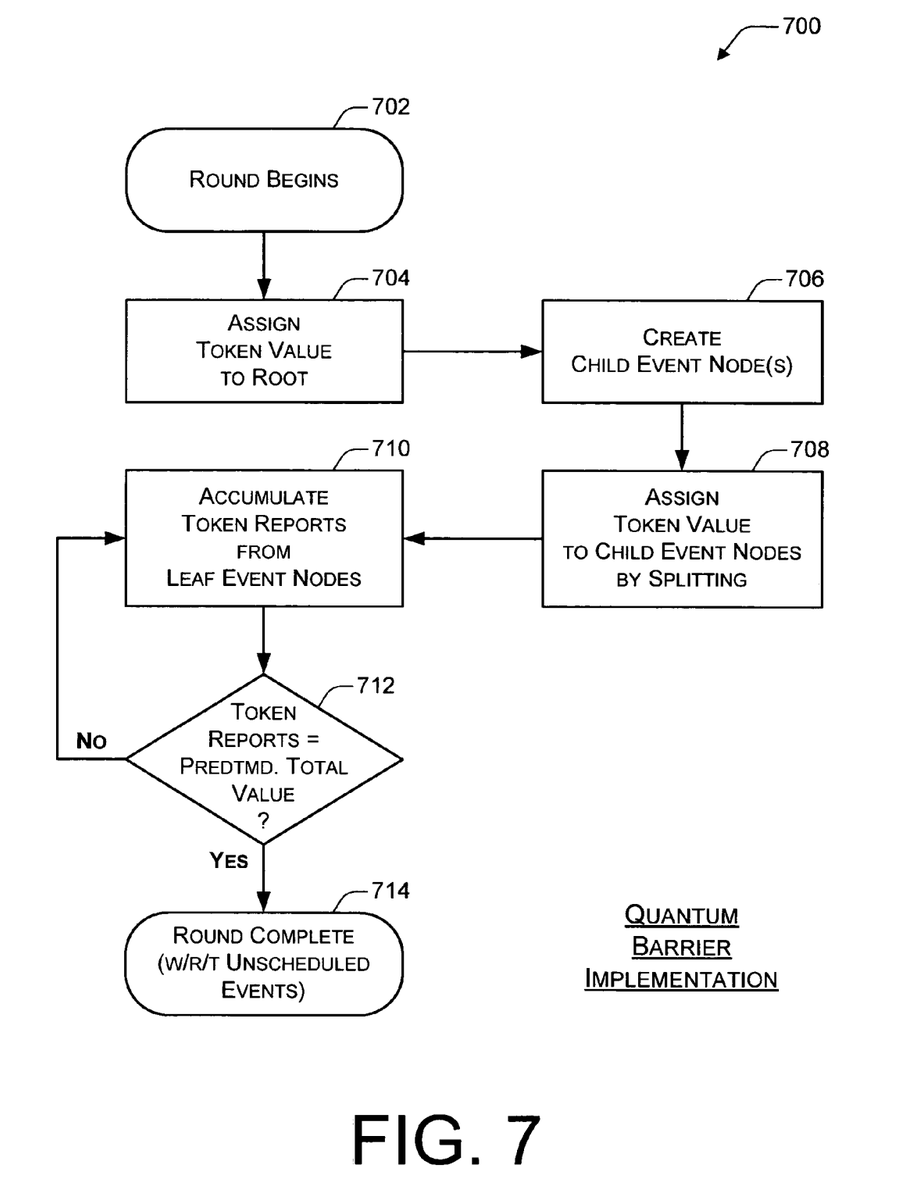
FIG. 7 is a flow diagram that illustrates an example of a method for implementing a quantum barrier with a runtime spanning tree.

FIG. 7 is a flow diagram 700 that illustrates an example of a method for implementing a quantum barrier with a runtime spanning tree. Flow diagram 700 includes seven (7) blocks 702-714. Although the actions of flow diagram 700 may be performed in other environments and with a variety of hardware and software combinations, a device 302 that is described herein above with particular reference to FIG. 3 may be used to implement the method of flow diagram 700. The logical architecture 200 of FIG. 2 and the runtime spanning tree 600 of FIG. 6 are referenced to further explain the method.

At block 702, a round begins. Although the number of scheduled events may be known when the round begins, the number of unscheduled events is unknown. At block 704, a token value is assigned to a root node. For example, master 102 may assign a pre-selected token value to each slave 104/LP 202. This pre-selected token value may be one (1), a value equivalent to one divided by the total number of LPs 202, and so forth. The pre-selected token value affects the "predetermined total value" of block 714, which is described herein below. The assignment of the root token value need not take place each round. Alternatively, it may be performed at the start of a simulation, permanently set as part of the simulation program, and so forth.

At block 706, child event nodes are created. For example, nodes N1-N9, Nx, and Ny may be created. They may be created, for instance, at a single slave 104/LP 202. At block 708, token values are assigned to child event nodes by splitting the token value of the parent. Each parent node may split its token value, for example, and assign the split token value or values to the child nodes. For instance, the first token-based approach (which is described above), the second token-based approach (which is described below), or some other approach may be used to split token values and assign the split values to child nodes.

At block 710, token reports are accumulated from leaf event nodes. For example, master 102 may accumulate token value reports from child events that correspond to leaf event nodes. At block 712, it is determined if the sum of the reported token values is equal to a predetermined total value. This determination may be performed for all LPs as a group or LP-by-LP. For example, if it is performed for all LPs, then the predetermined value may be equal to the number of total LPs or equal to one, depending on what token values are assigned to the roots. If the determination is performed LP-by-LP, then the predetermined value may be set equal to one, for instance, when each LP is assigned a root token value of one. In an actual implementation, the root token value and the predetermined total value are interrelated, but they may be jointly set to any numeric value.

If the reported token values do equal the predetermined value (as determined at block 712), then the round is complete at block 714, at least with respect to the processing of unscheduled events. Otherwise, if they are not equal, then the accumulation of token reports from leaf event nodes continues at block 710.

The second token-based approach is shown graphically in FIG. 6. In short, each parent's token is split by half each time a new child event is generated. This can be performed without knowing what the total number of child events will ultimately be for a given parent event. Also, each token value is represented by an integer i. Using an integer avoids the underflow issue that afflicts the use of fractions. In a described implementation, the token value i effectively represents the following fraction: $1/(2^{\wedge}\text{-}i)$.

Mapping back to the simulation architecture described herein, the master can function as the central repository to collect the reported tokens. In a described implementation, each critical LP is assigned a token with a value of 1 at the start of a round. The master sums up all the tokens reported back from the slaves/LPs that have executed any events in the round. If the sum is equal to the number of critical LPs, the current round terminates.

With reference to FIG. 6, runtime spanning tree 600 includes the assigned token values for each node. The middle item in each event node is the fractional value of the token. The bottom item in each event node is the token value in a non-fractional form. Specifically, it is the i=value that expresses or represents the token value in an exponential variable format (e.g., $1/(2^{\wedge}\text{-}1)$). Thus, when the exponential variable i=1, the token value is ½. Similarly, when i=2, the token value is ¼, and when i=3, the token value is ⅛.

By way of example only, node N1 has a token value of ½. When a child event node N3 is created, node N3 is given ½ of ½, or ¼. The exponential variable equivalent is i=2. Node N1 then has ¼ for a current token value. Creating another child event node causes node N1 to assign ½ of ¼, or ⅛, to child event node N4. When child event node N5 is created, it is determined that this is the last child event node, so parent node N1 assigns all of its remaining token value, or ⅛, to child event node N5.

When a leaf node is subsequently processed (possibly by another LP), the LP of the leaf node sends a token value report 604 back to the master. Because an LP likely processes multiple events, it is not necessary for every leaf event to separately report to the master; instead, the leaf node reports are aggregated and included in the SYNC messages.

Figure 8:
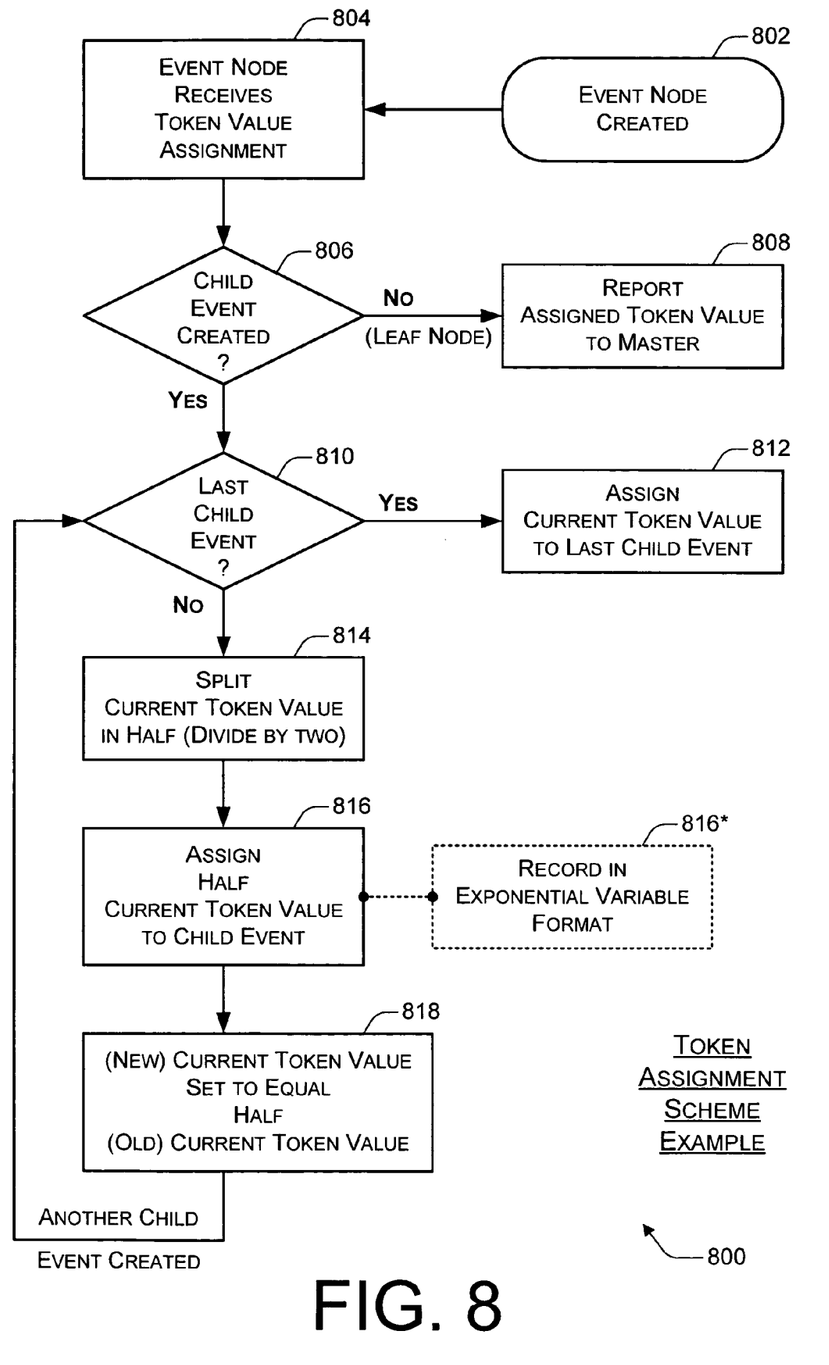
FIG. 8 is a flow diagram that illustrates an example of a method for assigning tokens to facilitate traversal of a runtime spanning tree when using a distributed apparatus.

FIG. 8 is a flow diagram 800 that illustrates an example of a method for assigning tokens to facilitate traversal of a runtime spanning tree when using a distributed apparatus. Flow diagram 800 includes nine (9) blocks 802-818, plus block 816\*. Although the actions of flow diagram 800 may be performed in other environments and with a variety of hardware and software combinations, a device 302 that is described herein above with particular reference to FIG. 3 may be used to implement the method of flow diagram 800. The logical architecture 200 of FIG. 2 and the runtime spanning tree 600 of FIG. 6 are referenced to further explain the method.

The token assignment scheme example of flow diagram 800 illustrates example actions for an LP 202 to undertake during the execution of a given event node. At block 802, an event node is created. For example, the child event node that is created may be either a parent event node or a leaf event node. At block 804, the event node receives a token value assignment. For example, the child event node that is created may receive a token value assignment from its parent event node.

At block 806, it is determined if a child event is created by the event node. If not, then the event node is a leaf node. At block 808, the leaf node reports its assigned token value back to the master after its corresponding event is processed. If, on the other hand, a child event is created, then the placement of the child event is evaluated at block 810.

At block 810, it is determined if the created child event is the last or final child event to be created by the event node. If the created child event is the last child event to be created, then at block 812 the current token value of the event node is assigned to the last child event.

If, on the other hand, the created child event is not determined (at block 810) to be the last child event, then at block 814 the current token value of the event node is split in half (i.e., divided by two). At block 816, half of the current token value is therefore assigned to the child event. As indicated by block 816*, the assigned token value may be represented or recorded in exponential variable format. For example, an integer representing a variable exponent may be used to represent the fractional token.

At block 818, a new current token value is set equal to half of the old current token value. In other words, the event node retains one-half of its current token value whenever a non-final child event is created. When another child event is created, the method of flow diagram 800 continues at block 810.

The devices, actions, aspects, features, functions, procedures, modules, data structures, protocols, architectures, components, etc. of FIGS. 1-8 are illustrated in diagrams that are divided into multiple blocks. However, the order, interconnections, interrelationships, layout, etc. in which FIGS. 1-8 are described and/or shown are not intended to be construed as a limitation, and any number of the blocks can be modified, combined, rearranged, augmented, omitted, etc. in any manner to implement one or more systems, methods, devices, procedures, media, apparatuses, APIs, arrangements, etc. for distributed system simulation.

Although systems, media, devices, methods, procedures, apparatuses, techniques, schemes, approaches, procedures, arrangements, and other implementations have been described in language specific to structural, logical, algorithmic, and functional features and/or diagrams, it is to be understood that the invention defined in the appended claims is not necessarily limited to the specific features or acts described above. Rather, the specific features and acts described above are disclosed as example forms of implementing the claims.

What is claimed is:

1. A method to perform on a plurality of computing devices a simulation of a distributed system, the simulation occurring round by round, the method comprising:
   receiving, by a logical process operated by one of the computing devices, an event having a timestamp;
   determining, by the one of the computing devices, if the timestamp of the event is less than a local time of the logical process;
   if the timestamp of the event is determined to be less than the local time of the logical process, substituting, by the one of the computing devices, the local time of the logical process for the timestamp of the event;
   determining by the one of the computing devices that all logical processes operating on the computing devices have finished processing all events for a given round;
   after the determining that all the logical processes have finished processing all the events, calculating by the one of the computing devices a new relaxation width of a simulation window, the new relaxation width being responsive to at least one runtime simulation parameter, the value of the relaxation width exceeding a global lookahead value for the distributed system being simulated, wherein the calculating comprises ensuring that the relaxation width does not exceed one-half of a timeout interval that is related to maintaining nodal knowledge of the distributed system being simulated; and
   sending the new relaxation width to other computing devices.

2. The method as recited in claim 1, further comprising:
   adding, by the one of the computing devices, the event having the local time to an event queue of the logical process; and
   processing the event having the local time.

3. The method as recited in claim 2 wherein adding the event having the local time comprises inserting the event having the local time at a head position of the event queue of the logical process.

4. The method as recited in claim 1, wherein the logical process is executing at least part of the simulation of the distributed system, and the local time of the logical process comprises a current logical time of the simulation.

5. The method as recited in claim 1, further comprising:
   if the timestamp of the event is not determined to be less than the local time of the logical process, inserting the event into an event queue of the logical process at a chronological position based on the timestamp of the event.

6. The method as recited in claim 1, further comprising:
   prior to receiving any events, receiving by the one of the computing devices, a message from another computing device, the message comprising a list of scheduled events for a current round for the logical process;
   determining, by the one of the computing devices, if the received event is a scheduled event by determining whether the event is found in the list of scheduled events for the current round for the logical process;
   if the event is determined to be a scheduled event, adding, by the one of the computing devices, the scheduled event to an event queue of the logical process.

7. One or more processor-accessible storage media comprising processor-executable instructions that, when executed by a processor, implement a method to perform a simulation of a distributed system synchronously, the method comprising:
   determining by a master computing device a relaxation width of a simulation window for a round of execution that exceeds a global lookahead value of the distributed system;
   adjusting the relaxation width of the simulation window responsive to at least one runtime parameter, the at least one runtime parameter including a timeout interval that is related to maintaining nodal knowledge of the distributed system being simulated, the adjusting comprising ensuring that the relaxation width does not exceed one-half of the timeout interval; and
   sending the relaxation width from the master computing device to one or more slave computing devices.

8. The one or more processor-accessible storage media as recited in claim 7, wherein the method further comprises handling slow unscheduled messages that are behind a local clock of a logical process by increasing a respective latency of each respective slow unscheduled message of the slow unscheduled messages.

9. The one or more processor-accessible storage media as recited in claim 7, wherein the method further comprises handling a slow unscheduled message having a timestamp that is less than a current local time of a logical process by replacing the timestamp with the current local time of the logical process.

10. The one or more processor-accessible storage media as recited in claim 7, wherein the at least one runtime parameter also comprises one or more of a current speed of the simulation, a previous speed of the simulation, a directional change coefficient, or a previous relaxation width.

11. The one or more processor-accessible storage media as recited in claim 7, wherein the simulation is performed in rounds, the method further comprising:
determining a duration responsive to the relaxation width of the simulation window;
sending by the master computing device a global time to a logical process to which local time of the logical process is to be advanced in a given round and a listing of safe events that are scheduled for execution in the given round by the logical process.

12. An apparatus to perform a simulation of a distributed system, the apparatus comprising:
a master computing device that adapts a relaxation width of a simulation window of the simulation of the distributed system responsive to at least one runtime parameter, the at least one runtime parameter including a timeout interval that is related to maintaining nodal knowledge of the distributed system being simulated, and the adapting comprising ensuring that the relaxation width does not exceed one-half of the timeout interval;
wherein the master computing device comprises:
one or more processors;
a global time ascertainer that ascertains a globally lowest clock; and
a determiner of safe scheduled events for each logical process in the simulation; and
wherein the master computing device sends the ascertained globally lowest clock and those safe scheduled events corresponding to each logical process to the corresponding logical process; and
a plurality of slave computing devices communicatively coupled to the master computing device, each slave computing device having a logical process that replaces a timestamp of an event with a local time of the logical process if the timestamp is less than the local time,
wherein each slave computing device comprises an event queue having multiple events that are chronologically ordered, a head event of the multiple events located at a head of the event queue, and wherein the local time of the logical process is established by a timestamp of the head event, and
wherein the logical process processes events in the event queue in chronological order.

13. The apparatus as recited in claim 12, further comprising:
another slave computing device having another logical process;
wherein the logical process is associated with a first set of nodes, and the another logical process is associated with a second set of nodes, each node of the first and second sets of nodes forming a node of the distributed system; and
wherein the logical process sends to the master computing device at the conclusion of a current simulation round a concluding local time and a list of scheduled events, along with their associated timestamps, that were sent to the another logical process during the current simulation round.

* * * * *